United States Patent [19]
Bakhru et al.

[11] Patent Number: 5,241,131
[45] Date of Patent: Aug. 31, 1993

[54] EROSION/CORROSION RESISTANT DIAPHRAGM

[75] Inventors: Nanik Bakhru, Danbury, Conn.; Alfred Grill, White Plains; Gregory S. Hopper, Fishkill, both of N.Y.; Egidio Marotta, College Station, Tex.; Bernard S. Meyerson; Vishnubhai V. Patel, both of Yorktown Heights, N.Y.

[73] Assignee: International Business Machines Corporation, Armonk, N.Y.

[21] Appl. No.: 868,371

[22] Filed: Apr. 14, 1992

[51] Int. Cl.$^5$ .......................................... H05K 7/20
[52] U.S. Cl. .................................. 174/15.1; 257/714; 361/689; 428/408; 428/698; 428/699
[58] Field of Search ............... 174/15.1; 257/713, 714; 361/382, 385; 428/698, 699, 408

[56] References Cited

U.S. PATENT DOCUMENTS

| | | | |
|---|---|---|---|
| 4,381,032 | 4/1984 | Cutchaw | 165/46 |
| 4,531,146 | 7/1985 | Cutchaw | 165/46 |
| 4,612,978 | 9/1986 | Cutchaw | 361/385 X |
| 4,740,866 | 4/1988 | Kajiwara et al. | 361/382 |
| 4,750,086 | 7/1988 | Mittal | 361/382 |
| 4,928,207 | 5/1990 | Chrysler et al. | 361/385 |
| 5,023,690 | 6/1991 | Umezawa et al. | 357/82 |
| 5,031,029 | 7/1991 | Acocella et al. | 357/81 |
| 5,097,385 | 3/1992 | Chao-Fan Chu et al. | 361/382 |
| 5,166,863 | 11/1992 | Shmunis | 361/385 |

OTHER PUBLICATIONS

IBM Technical Disclosure Bulletin, vol. 20, No. 8, p. 3121 Jan. 1978, A. H. Johnson, "Diaphragm Cooling for Devices".

IBM Technical Disclosure Bulletin, vol. 20, No. 10, p. 3919 Mar. 1978, A. H. Johnson, "Device Cooling".

IBM Technical Disclosure Bulletin, vol. 28, No. 1B, pp. 494-495 Jun. 1984, C. D. Ostergren, "Mini Conformal Cold Plate".

IBM Technical Disclosure Bulletin, vol. 28, No. 11, pp. 4759-4761 Apr. 1986, "New TCM Design Using Bellows".

IBM Technical Disclosure Bulletin, vol. 29, No. 7, p. 2887 "Liquid-Cooled Circuit Package With Jet Impinging on Heat Sink Held Against Semiconductor Chip That is Sealed From The Jet".

IBM Journal of Research & Development, vol. 34, No. 6, pp. 849-857 Nov. 1990, "Diamondlike Carbon Films by RF Plasma-Assisted Chemical Vapor Deposition From Acetylene".

International Conference on Metallurgical Coatings and Thin Films, San Diego, Apr. 22, 1991, "Diamond-like carbon as an electrical insulator of copper device for chip cooling".

*Primary Examiner*—Morris H. Nimmo
*Attorney, Agent, or Firm*—Aziz M. Ahsan

[57] ABSTRACT

The present invention relates generally to a new erosion/corrosion resistant diaphragm, and more particularly to an erosion/corrosion resistant diaphragm that can be used in an apparatus for cooling integrated circuit chips. An erosion/corrosion resistant coating can be provided on one side of a metallic foil that will be exposed to fluid impingement. And, a similar erosion/corrosion resistant coating can be provided on the opposite side of the metallic foil where the normal thermal cycling of the chip might damage the unprotected metallic foil.

27 Claims, 2 Drawing Sheets

EROSION/CORROSION RESISTANT DIAPHRAGM

FIELD OF THE INVENTION

The present invention relates generally to a new erosion/corrosion resistant diaphragm, and more particularly to an erosion/corrosion resistant diaphragm that can be used in an apparatus for cooling integrated circuit chips.

BACKGROUND OF THE INVENTION

The use of integrated circuit chips has increased dramatically over the years. Although chip size has decreased and power usage is more efficient than in the past, the practice of mounting multiple, closely spaced chips in modules has required that more emphasis be placed on cooling systems to remove the relatively high density power dissipated by the chips. Liquid coolants are commonly employed in high density applications for cooling the chips.

One problem associated with cooling integrated circuit chips mounted on a substrate is that some of the chips may be tilted or bent and otherwise may have height variations between chips. It is desirable that any cooling system accommodate slightly different chip orientations while providing approximately equal cooling to each chip site.

The prior art has suggested various systems for cooling high powered integrated circuit chips, including those in which multiple chips are arrayed in modules. Previous thermal conductive modules (TCMs) have utilized pistons contained in water cooled housings which contact the chip. Some systems have incorporated water cooled bellows to cool the chip. Such systems are exemplified by IBM Technical Disclosure Bulletin, Vol. 28, No. 11, pp. 4759–4761 (April 1986). Another chip cooling arrangement is suggested in IBM Technical Disclosure Bulletin, Vol. 27, No. 1B, pp. 494–495 (June 1984) in which a copper structure having an internal radial water cooling pattern is conformally interfaced using a layer of a metal alloy with a single semi-conductor chip.

Other systems for cooling high powered chips utilize a cooled foil to cover a plurality of chips. One of such systems, disclosed in U.S. Pat. No. 4,381,032, uses a piston to hold the foil against each chip and a liquid coolant which flows around the piston to remove heat conducted through the foil. Another system which utilizes a heat conductive foil over the integrated circuit chips is disclosed in U.S. Pat. No. 4,531,146. IBM Technical Disclosure Bulletin, Vol. 29, No. 7, p. 2887 (December 1986) discloses yet another system which utilizes a metal heat sink carried on a flexible seal for each chip which is spring loaded downwardly against the chip. The upper surface of the heat sink carries fins and is cooled by a jet of coolant.

In a system disclosed in a recent patent issued to the assignee of this application, Chrysler et al. U.S. Pat. No. 4,928,207, the coolant is carried to each chip through the central bore of a piston which is spaced away from the chip by a spacer having radial vanes. However, this system uses a dielectric coolant which contacts the chips directly and does not create the problems of erosion/corrosion.

Acocella, J. et al. "Copper Device and Use Thereof With Semiconductor Devices" U.S. Pat. No. 5,031,029, the disclosure of which is incorporated herein by reference, discloses a device that contains a copper substrate; a rigidizing layer and/or a metal layer, and a non-graphitic hard carbon layer deposited on the rigidizing layer; and use as a heat sink or piston for electronic components.

Although these systems are suitable in many ways, many require their components to be made to high mechanical tolerances and, consequently, are relatively expensive. This is especially true of those systems employing pistons in thermal conduction modules which form part of the path for heat transfer. Furthermore, the power density of multiple chip modules is expected to increase dramatically, particularly as systems approach very large scale integration (VLSI) densities in bipolar technology. This will require even higher thermal conductance between the chip and the coolant, which the present systems may not be able to accommodate. The use of water based coolants is desirable in this regard. Furthermore, it is necessary that the cooling system be reliable, relatively low in cost to manufacture, and easily replaceable in the field.

The ever increasing performance of the computer chips is associated with increasing chip power and the requirement for higher heat removal rates. The need for an extendable, low cost and high performance cooling system for the multi-chip module has lead to the design of cooling systems, such as, the "Indirect Impingement Cooling" as disclosed in U.S. patent application Ser. No. 07/748,004, filed on Aug. 21, 1991, the disclosure of which is incorporated herein by reference. The cooling system of U.S. patent application Ser. No. 07/748,004, utilizes a fluid, such as water, which is forced to impinge on a thin metal diaphragm, such as a copper foil, which is in direct contact with the chips. The continuous impingement of the forced flow can cause erosion of the foil in the flow path, especially at the stagnation point of the flow opposite each chip. In addition, in spite of the use of deionized water, corrosion of the unprotected thin metal diaphragm and fouling can also occur.

Similarly, on the chip side of the thin metal foil of U.S. patent application Ser. No. 07/748,004, the relative movement of the unprotected thin metal diaphragm and chip due to thermal cycling can cause abrasion of the soft thin metal foil resulting in seizures of the chip corners into the foil. This can impose high stresses on the other components of the chip, such as C4s, lead joints, etc.

This invention overcomes those erosion and/or corrosion problems of an unprotected metallic foil by providing an erosion/corrosion resistant coating on one side of the metallic foil that will be exposed to the fluid impingement. And a similar erosion/corrosion resistant coating is provided on the opposite side of the metallic foil where the normal thermal cycling of the chip might damage the unprotected metallic foil.

OBJECTS AND SUMMARY OF THE INVENTION

Bearing in mind the problems and deficiencies in the prior art, and the requirements of new integrated chip technology, it is therefore an object of the present invention to provide a high performance cooling system for integrated circuit chips.

It is another object of the present invention to provide an integrated circuit chip cooling system which utilizes components made to relatively low mechanical tolerances.

It is yet another object of the present invention to provide an integrated circuit chip cooling system which utilizes an erosion/corrosion resistant diaphragm to protect the unprotected metallic foil from erosion, corrosion and other problems.

It is a further object of the present invention to provide a cooling system for integrated circuit chips which are tilted, bent, or have chip-to-chip height variations without stressing the connection between the chip and the chip substrate.

It is another object of the present invention to provide a multiple chip cooling system in which equal cooling can be provided at each chip site.

It is yet another object of the present invention to provide an integrated circuit chip cooling system which provides a high conductance thermal path between the chip and the coolant.

In one aspect this invention comprises an article for providing erosion and/or corrosion resistance comprising, a metallic foil having a first surface and a second surface, wherein at least a portion of said first surface of said metallic foil which will be exposed to erosion and/or corrosion has a coating of at least one rigidizing layer and one diamond like carbon layer or at least one rigidizing layer and successive coatings of stress relief material and diamond like carbon, to provide said erosion and/or corrosion resistance.

In another aspect this invention comprises an article for providing erosion and/or corrosion resistance comprising, a metallic foil having a first surface and a second surface, wherein at least a portion of said first surface and at least a portion of said second surface of said metallic foil which will be exposed to erosion and/or corrosion has a coating of at least one rigidizing layer and one diamond like carbon layer or at least one rigidizing layer and successive coatings of stress relief material and diamond like carbon, to provide said erosion and/or corrosion resistance.

In yet another aspect the invention comprises an erosion/corrosion resistance diaphragm for a cooling system of an integrated circuit chip, comprising a piston having a central opening for the passage of cooling fluid, said erosion/corrosion resistance diaphragm between said chip and said piston, and wherein said erosion/corrosion resistance diaphragm comprises, a metallic foil having a first surface and a second surface, wherein at least a portion of one of said surfaces of said metallic foil which will be exposed to erosion and/or corrosion has a coating of at least one rigidizing layer and one diamond like carbon layer or at least one rigidizing layer and successive coatings of stress relief material and diamond like carbon, to provide erosion and/or corrosion resistance.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
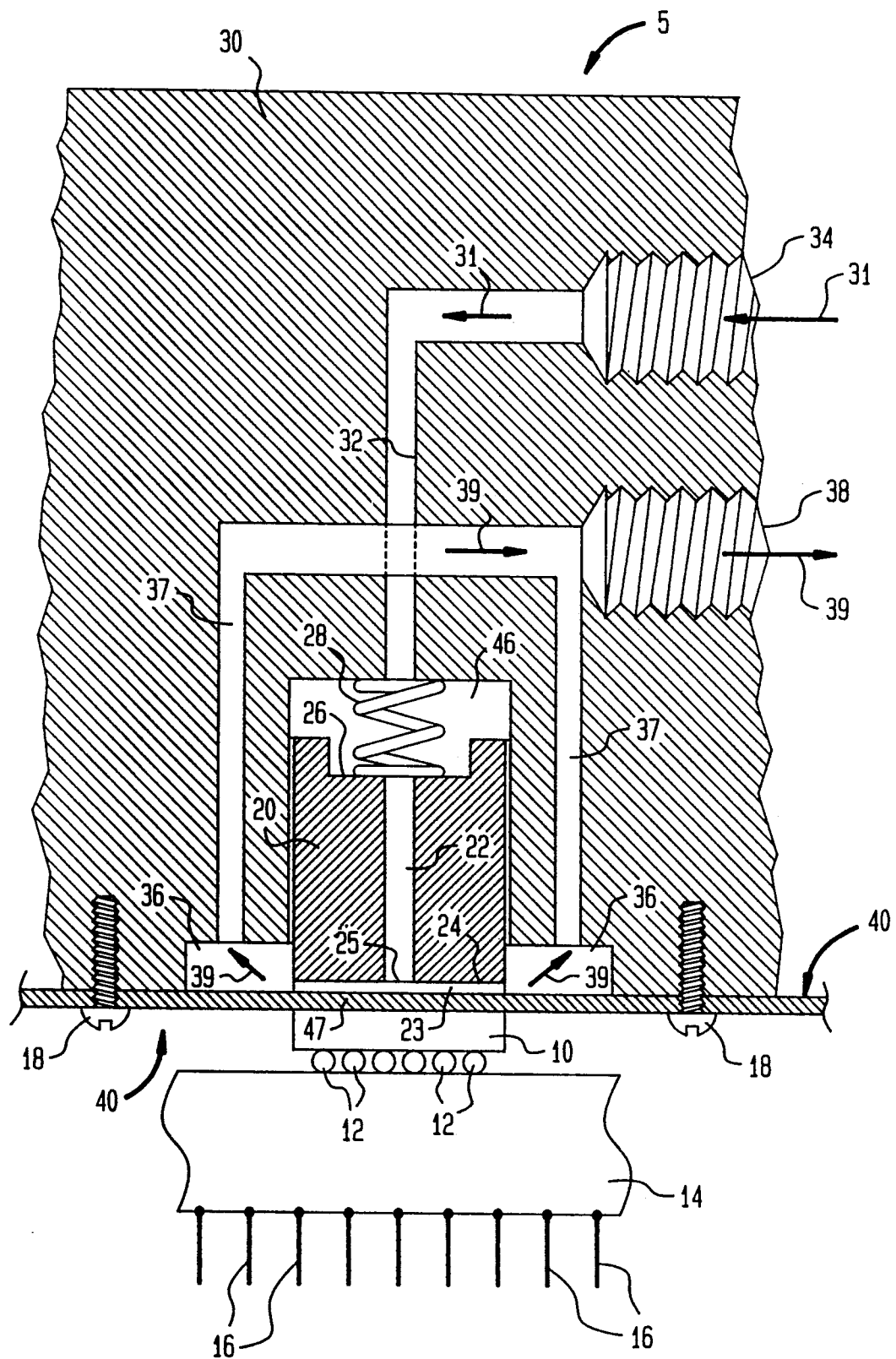
FIG. 1, is a sectional view of a thermal conduction module for an integrated circuit chip showing the erosion/corrosion resistant diaphragm of this invention.
Figure 2:
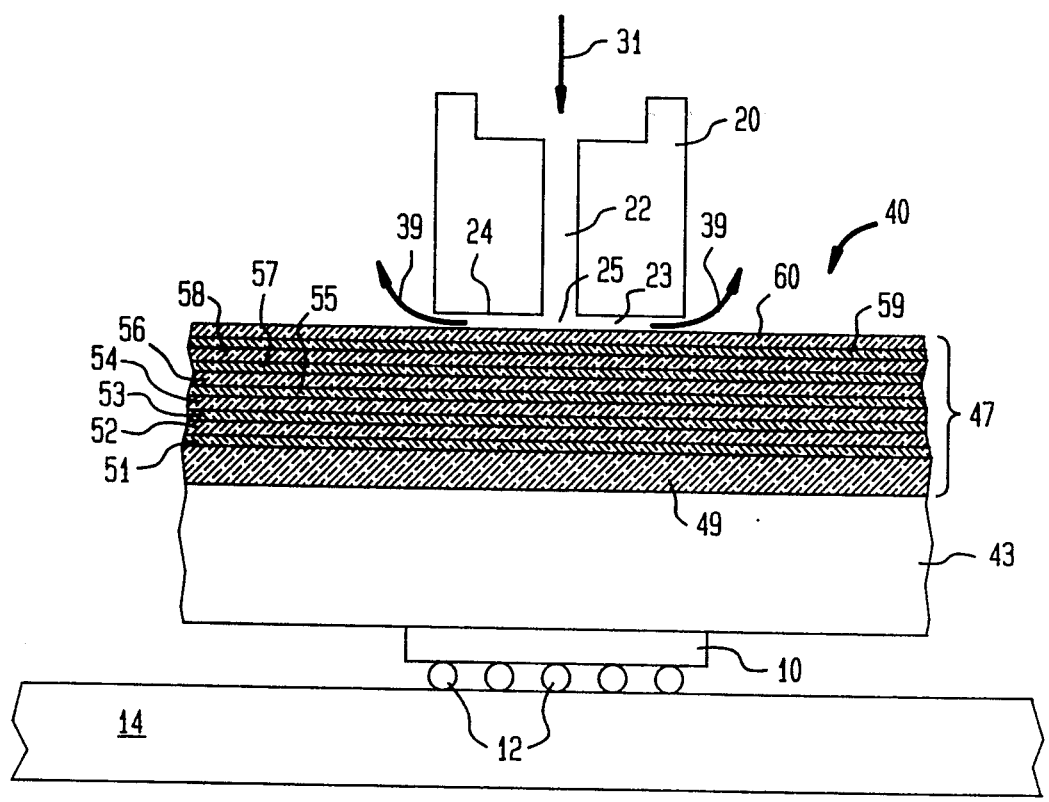
FIG. 2, is an enlarged sectional view showing the erosion/corrosion resistant diaphragm of this invention.
Figure 3:
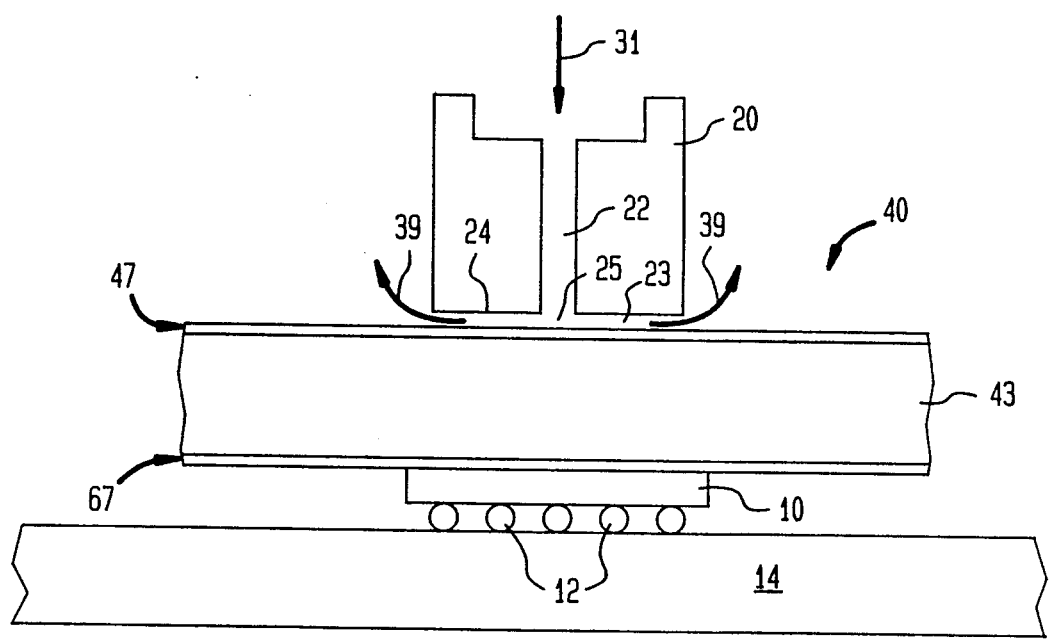
FIG. 3, is an enlarged sectional view showing another embodiment of the erosion/corrosion resistant diaphragm of this invention.

The present invention is depicted in FIGS. 1-3, in which like numerals refer to like features of the invention, but in which features are not necessarily drawn to scale.

FIG. 1, shows an embodiment of the present invention which utilizes the invention as disclosed in U.S. patent application Ser. No. 07/748,004, filed on Aug. 21, 1991, the disclosure of which is incorporated herein by reference. FIG. 1, shows a single or multi-unit thermal conduction module 5, which contains a device or an integrated circuit chip 10, mounted on a supporting substrate 14. The chip 10, normally has a flat upper surface, and a flat lower surface. The lower surface of the chip 10, is connected to the top of substrate 14, by a plurality of connections 12, for example, solder balls. This type of chip connection to the substrate is generally referred to as "flip chip" packaging. The lower surface of substrate 14, contains a plurality of pin connectors 16, that plug into a circuit board (not shown). The substrate 14, can be a single layer or a multilayer substrate. Wiring inside the substrate 14, brings power to the chips 10, and makes signal connections from one chip to another and between the chips and the pins.

Because of the power usage of chips 10, there is normally a substantial excess of heat built up which must be carried away to maintain the chip at the desired temperature range for operation. The chip connections 12, are limited in cross sectional area and therefore provide little heat conduction away from the chip 10.

To provide effective conduction of heat away from chip 10, the thermal conduction module 5, shown in FIG. 1, includes the inventive deformable, liquid impermeable, thermally conductive metallic diaphragm 40, which extends over and contacts the upper surface of the chip 10.

In order to prevent the erosion and/or corrosion of an unprotected metallic foil or diaphragm 43, exposed to fluids, such as water, and the erosion or abrasion on the chip side of the metallic diaphragm, the metallic foil or diaphragm 43, needs to be somehow protected.

This invention discloses one method of such protection, which is by coating the side(s) to be protected with at least one rigidizing layer and one diamond like carbon layer or at least one rigidizing layer and successive coatings of a stress relief material (such as amorphous silicon) and diamond like carbon, to provide the erosion and/or corrosion resistance. The diamond-like carbon (DLC) layer should preferably be the final external layer.

FIG. 2, shows one embodiment of the present invention. On one surface of the metallic foil 43, a rigidizing layer 49, is formed by conventional methods. Subsequently, successive layers of a stress relief material 51, 53, 55, 57 and 59, such as amorphous silicon, and diamond like carbon 52, 54, 56, 58 and 60, are formed over the rigidizing layer 49, to produce one embodiment of the inventive metallic diaphragm 40. For example, the rigidizing layer could be between about 2 to 5 microns thick, and the total thickness of the successive coatings of stress relief material and diamond like carbon could be between about 0.5 to about 1.5 microns thick.

In another embodiment, the successive layers 51 to 60, could be replaced with one layer of diamond like carbon of same total thickness, i.e., the total thickness for the one layer of diamond like carbon could be between about 0.5 microns to about 1.5 microns.

Diamond like carbon is very hard (hardness 3000–9000 kg/mm$^2$) and has high resistance to wear, i.e., low friction coefficient which is typically between about 0.01 to 0.28. Because of its extreme hardness and wear resistant property, DLC is well suited as a wear resistant protective coating for metals. Additional properties of DLC include higher thermal conductivity, and very high electrical resistivity (typically in the order of $10^{16}$ ohmscm), to name a few.

Depending on the deposition conditions, the diamond like carbon may have high internal stresses which can cause delamination from the substrate if deposited in thickness higher than 5,000 angstroms. In such case a structure composed of successive layers of stress relief material and diamond like carbon layers, typically between 500 and 1,200 angstroms thick has to be deposited.

Under other deposition conditions, such as DC plasma assisted CVD, reduced stresses and improved adhesion can be achieved and the multilayered structure can be replaced by at least one bonding or rigidizing layer, such as amorphous silicon and one layer of diamond like carbon, the DLC layer could be between about 0.5 to about 1.5 microns thick.

Diamond-like carbon or hydrogenated amorphous carbon is a very hard and chemically inert material as discussed by Grill, A. et al., "Diamondlike Carbon Films by rf Plasma-assisted Chemical Vapor Deposition From Acetylene", IBM J. Res. Develop., Vol. 34, No. 6, Pages 849–857 (November 1990), the disclosure of which is incorporated herein by reference.

As discussed earlier thin successive layers of DLC are desired, but, they can crack or be punctured when exposed to high pressures that maybe generated by particles trapped between the diaphragm 40, and the pistons 20, of the cooling system. Therefore, a hard rigidizing layer 49, is needed between the metallic foil 43, such as copper foil, and the erosion/corrosion resistant DLC layers.

Another reason for the rigidizing layer 49, is that the metallic foil 43, could be very thin or very soft, and could crack or be punctured as a result of a hard dust particle that may be trapped between the diaphragm 40, and the piston 20, of the cooling system.

As discussed earlier, a stress relief layer or material, such as amorphous silicon, may be required for stress relief in highly stressed DLC layers, which would otherwise delaminate. The amorphous silicon layers should preferably be between about 40 and 80 angstroms thick, and more preferably they should be about 50 angstroms thick.

This rigidizing layer 49, could comprise of a single layer of material or of a multilayer material. The rigidizing layer, could be selected from a group consisting of aluminum nitride, amorphous silicon, silicon nitride, titanium nitride, tungsten carbide, and mixtures thereof. The rigidizing layer is typically between about 2 to 5 microns thick.

The metallic foil 43, is preferably a flexible foil made of a metal which is a good thermal conductor, such as, aluminum, copper, gold, indium, lead, molybdenum, silver, tin, titanium, tungsten or the like, and alloys thereof. The metallic foil 43, could be a single layer structure or a multilayered structure. The thickness of the metallic foil 43, may vary, preferably no greater than about 0.25 mm (0.010 in.) and no less than about 0.05 mm (0.002 in.). The metallic foil 43, may be coated or plated on one or both sides with an erosion/corrosion resistant coating layer 47 and/or 67, to prevent fouling or other erosion/corrosion related effects.

It has also been found that a very thin layer of DLC can be used, to prevent the erosion/corrosion of the metal foil diaphragm 43, without reducing the thermal performance of the system. In order to get the best results the metal foil 43, should have at least a 0.5 micrometers thick diamond like carbon structure comprised of a single DLC layer or successive layers of DLC with stress relief layers, alongwith the appropriate rigidizing layer 49.

For example, using a DC biased substrate in an RF or DC plasma deposition apparatus, an erosion/corrosion resistant layer 47, comprising of diamond like carbon layers, preferably between 500 and 1,200 angstroms thick, alternating with amorphous silicon layers, preferably less than 80 angstroms thick, is deposited at a temperature of preferably between 140° to 250° C., as disclosed in U.S. Pat. No. 5,031,029. Diamond like carbon can also be deposited by a variety of other methods, such as, sputtering, magnetron sputtering, ion beam sputtering, ion beam deposition, laser ablation, to name a few.

In another embodiment of this invention as shown in FIG. 3, the erosion/corrosion resistant layers 47 and 67, are formed on both sides of the metallic foil 43. As discussed earlier on the chip side of the diaphragm 40, the relative movement of the diaphragm 40, and chips 10, due to thermal cycling can cause scratching/abrasion of an unprotected metallic diaphragm, resulting in seizures of the chip corners into the metal diaphragm. This can impose high stresses on the C4 lead joints, resulting in their catastrophic failure.

These erosion/corrosion resistant layers 47 and 67, can be as little as about 0.6 to about 1 micrometers thick, to prevent erosion/corrosion, and abrasion of the metallic foil 43, which is in contact with the fluid flow or with the chip.

In the preferred embodiment the metallic foil is copper or alloys thereof, the stress relief material is amorphous silicon, and the material for the rigidizing layer is either amorphous silicon or titanium nitride.

Typically, a layer between about 2 to about 5 microns thick, preferably 2.5 microns thick, made of silicon, amorphous silicon, silicon nitride or titanium nitride can serve as the rigidizing layer 49. The rigidizing layer can easily be deposited on metal used for the diaphragm, such as a copper diaphragm. If amorphous silicon is used as a rigidizing layer than it must be thick, for example, at least 2.5 microns.

The erosion/corrosion resistant diaphragm 40, could be secured by some securing means, such as by fasteners 18, to the underside of module cap or housing 30 (also referred to as a "hat") to provide a liquid-tight enclosure for the coolant which passes through the internal structure of the apparatus, as will be described in more detail below.

To hold diaphragm 40, firmly in place over the chip 10, and conform it to the chip upper surface for maximum thermal conductivity, there is provided a piston 20, which is slideably disposed within chamber 46, in the module cap or housing 30. Piston 20, is independently suspended within chamber 46, such that the lower end of piston 20, extends from the open bottom. Biasing means 28, such as a compression spring 28, bears against internal piston shoulder 26, to urge the piston 20, downward against the upper surface of diaphragm 40, in order to provide close contact between the diaphragm 40, and the upper surface of the chip 10. Some spacing is permitted between the walls of piston 20, and piston chamber 46, to allow the piston 20, to cock slightly so that the flat piston lower face 24, may sit squarely against and accommodate tilted or bent chips 10.

Piston 20, may be of any desired configuration and is most preferably in the general shape of a right circular cylinder. However, the piston may have cross sections (as seen in the plane cut normal to the longitudinal axis) other than circular, for example, square or oblong. The piston 20, preferably has about the same width as the underlying chip 10, but the width of the piston 20, may be larger or smaller than the width of the chip 10.

The actual cooling of the diaphragm 40, is provided by convection via a fluid, such as water or other water based coolant which circulates through the module cap 30, above the diaphragm 40. The coolant enters through coolant inlet 34, and inlet channel 32, in the direction shown by the arrow 31, downward into piston chamber 46. The piston 20, having a flat lower face 24, has an opening which narrows down to a central opening or bore 22, which extends through the piston body coaxially with the longitudinal axis of the piston. The coolant fluid travels downwardly through the piston bore 22, and impinges on and around the area 25, over the diaphragm 40, directly above the chip 10. The lower end of the piston bore 22, communicates with a plurality of shallow radial channels 23, that are in the flat lower face 24, of the piston 20, as more clearly discussed and disclosed in U.S. patent application Ser. No. 07/748,004, which are integrally formed or molded in the lower face or surface of the piston 20. These channels 23, are open to the lower end of piston and provide passageways for directing the flow of coolant symmetrically radially outward from bore 22, and along the upper surface of the diaphragm 40. A person skilled in the art could easily optimize the height and width of these piston channels 23, to meet specific cooling requirements.

It is important that the lower face of the piston 20, have sufficient surface area so that the piston is able to hold and secure diaphragm 40, firmly against the upper surface of chip 10. In this regard, it is preferred that the width of each segment of lower piston face along the piston periphery have approximately the same or greater dimension than the width of adjacent channel. The piston face segments are preferably substantially wider (relative to the adjacent channels) than the narrow vanes shown in spacers 22, of Chrysler et al. U.S. Pat. No. 4,928,207.

The number of channels 23, employed on the lower face of the piston 20, may be varied according to the amount of heat to be removed from the chip 10, through diaphragm 40. However, it is preferred that a plurality of channels 23, in the radial pattern be employed for optimum heat transfer. As the coolant flows through the channels 23, between piston 20, and the top surface of diaphragm 40, it removes by convective heat transfer the heat which is conducted through diaphragm 40, from chip 10. Because of the potentially corrosive properties of the aqueous coolant and the obvious problem of short circuiting of chip 10, it is important that the diaphragm 40, and its enclosure with module cap 30, be water-tight to prevent leakage of the coolant into the areas directly contacting the chip 10, and the substrate 14.

Below the diaphragm 40, the substrate 14, and chips 10, may be encapsulated in an inert atmosphere, such as helium or nitrogen, or, alternatively, they may be covered with a dielectric fluid such as mineral oil. If oil is used, an aneroid or pressure compensator may be required.

Following passage through the piston channels 23, the coolant passes outward from around the base of the piston 20, into chamber 36, where it then passes upward through outlet channel 37, between the piston enclosure and module cap or housing 30, and thereafter exits the module cap 30, via coolant outlet 38, as indicated by the arrows 39.

Unlike many prior art designs, the piston 20, does not directly form part of the path of heat transfer, i.e., heat removed from the chip 10, is not substantially conducted through the piston 20. Instead, the piston 20, has the function of (a) holding the diaphragm 40, closer to the chips upper surface for maximum conductive heat transfer from the chip 10, to the diaphragm 40, and (b) providing a predetermined path for passage of liquid coolant over the diaphragm 40, and indirect impingement above each chip for maximum convective heat transfer from the diaphragm 40, to the coolant. Consequently, unlike those prior art systems in which the piston provides part of the path for conduction of the heat, it is not necessary that the piston 20, be made of a thermally conductive material, nor is it necessary that it be made to high mechanical tolerances. As such, pistons 20, may be made entirely out of a non-electrically conductive material, such as plastic which may be injection molded or otherwise formed to the relatively low tolerances typical of these applications.

In thermal conduction modules which contain multiple chips, size and power consumption can differ among the various chips. In such cases, cooling can be customized within the same module to conform cooling characteristics of each piston to the individual chip locations. This may be done, for example, by appropriately varying the piston material selection, the diameter of the piston and its central bore opening, the size and configuration of the channels on the piston lower surface, and other parameters to match the degree of cooling required at the individual chip.

Thus, the thermal conduction module 5, provides an apparatus for cooling integrated circuit chips which may be easily manufactured, but, which uses a high thermal capacity water based coolant in a system which provides a unique erosion/corrosion resistant diaphragm. The diaphragm has a novel coating on the fluid impingement side to prevent erosion/corrosion of the unprotected metallic foil and a second novel coating on the chip side to prevent erosion/corrosion of the unprotected metallic foil due to the stresses imposed by the thermal cycling of the chip.

The following example is intended to further illustrate the invention and is not intended to limit the scope of the invention in any manner.

EXAMPLE

DLC films are prepared by the RF plasma decomposition of acetylene, $C_2H_2$. The plasma is sustained in a parallel plate geometry by a capacitive discharge at 13.56 MHz at a surface power density of 110 mW/cm². Decomposition is performed at an acetylene flow rate of 6 sccm and a pressure of 30 microns, on cathode mounted substrates held at deposition temperatures, $T_d$, in the range $140°\ C. < T_d < 250°\ C$. The cathode bias is held fixed at $-100$ VDC using RF choke isolated DC power supply. The deposition temperature is limited to the range given above because with deposition temperatures above 325° C., the DLC films become graphitic in nature and soften significantly. 1,000 angstroms thick DLC layer was deposited alternating with interfacial amorphous silicon layers approximately 50 angstroms thick at a temperature of 140° to 250° C.

The erosion/corrosion resistant layer 47, prevents the erosion, corrosion of the metal diaphragm 40, in contact with the water flow. The interfacial amorphous silicon layers mentioned above are deposited under similar conditions from a gas mixture of 1 percent silane in Argon.

Thus the erosion/corrosion resistant layer 47 or 67, is deposited as a multilayer structure comprising of diamond like carbon layers about 1,000 angstroms thick interrelated with amorphous Si layers about 50 angstroms thick. Alternatively, one thick low stress layer of DLC can be deposited.

Because the metal diaphragm is very soft, a rigidizing layer, a few microns thick, is deposited between the DLC and metal diaphragm in order to reduce eventual cracking of the hard layer under possibly large bending strains, which may result if a hard dust particle is trapped between the diaphragm and the pistons of the cooling system. The rigidizing layer of amorphous silicon or silicon nitride (SiN) or titanium nitride (TiN), approximately 2-3 microns thick was deposited in a separate system. The rigidizing layer can easily be deposited on copper or other metals used for the diaphragm. Using the above-mentioned process the erosion/corrosion resistant coating comprising DLC, amorphous silicon and rigidizing layer were deposited on one or both sides of the metallic foil.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An article for providing erosion and/or corrosion resistance comprising, a metallic foil having a first surface and a second surface, wherein at least a portion of said first surface of said metallic foil which will be exposed to erosion and/or corrosion has a coating of at least one rigidizing layer and one diamond like carbon layer or at least one rigidizing layer and successive coatings of stress relief material and diamond like carbon, to provide said erosion and/or corrosion resistance and wherein said second surface is in contact with at least one integrated circuit chip.

2. The article of claim 1, wherein said metallic foil is selected from a group consisting of aluminum, copper, gold, indium, lead, molybdenum, silver, tin, titanium, tungsten, and alloys thereof.

3. The article of claim 1, wherein said stress relief material is amorphous silicon.

4. The article of claim 1, wherein said rigidizing layer is selected from a group consisting of aluminum nitride, amorphous silicon, silicon nitride, titanium nitride, tungsten carbide, and mixtures thereof.

5. The article of claim 1, wherein the total thickness of said diamond like carbon layer is between about 0.5 to about 1.5 microns thick.

6. The article of claim 1, wherein said rigidizing layer is between about 2 to 5 microns thick, and the total thickness of said successive coatings of stress relief material and diamond like carbon is between about 0.5 to about 1.5 microns thick.

7. The article of claim 1, wherein said rigidizing layer is between about 2 to 5 microns thick, said stress relief material coating is between about 40 and 80 angstroms thick, preferably about 50 angstroms thick, and said diamond like carbon coating is between about 500 and 1,200 angstroms thick, preferably between about 800 and 1,000 angstroms thick, and more preferably about 1,000 angstroms thick.

8. The article of claim 1, wherein said metallic foil is copper or alloys thereof, said stress relief material is amorphous silicon, and the material for said rigidizing layer is either amorphous silicon or titanium nitride.

9. The article of claim 8, wherein said rigidizing layer is between about 2 to 5 microns thick, said stress relief material coating is between about 40 and 80 angstroms thick, preferably about 50 angstroms thick, and said diamond like carbon coating is between about 500 and 1,200 angstroms thick, preferably between about 800 and 1,000 angstroms thick, and more preferably about 1,000 angstroms thick.

10. An article for providing erosion and/or corrosion resistance comprising, a metallic foil having a first surface and a second surface, wherein at least a portion of said first surface and at least a portion of said second surface of said metallic foil which will be exposed to erosion and/or corrosion has a coating of at least one rigidizing layer and one diamond like carbon layer or at least one rigidizing layer and successive coatings of stress relief material and diamond like carbon, to provide said erosion and/or corrosion resistance.

11. The article of claim 10, wherein said metallic foil is selected from a group consisting of aluminum, copper, gold, indium, lead, molybdenum, silver, tin, titanium, tungsten, and alloys thereof.

12. The article of claim 10, wherein said stress relief material is amorphous silicon.

13. The article of claim 10, wherein said rigidizing layer is selected from a group consisting of aluminum nitride, amorphous silicon, silicon nitride, titanium nitride, tungsten carbide, and mixtures thereof.

14. The article of claim 10, wherein the total thickness of said diamond like carbon layer is between about 0.5 to about 1.5 microns thick.

15. The article of claim 10, wherein said rigidizing layer is between about 2 to 5 microns thick, and the total thickness of said successive coatings of stress relief material and diamond like carbon is between about 0.5 to about 1.5 microns thick.

16. The article of claim 10, wherein said rigidizing layer is between about 2 to 5 microns thick, said stress relief material coating is between about 40 and 80 angstroms thick, preferably about 50 angstroms thick, and said diamond like carbon coating is between about 500 and 1,200 angstroms thick, preferably between about 800 and 1,000 angstroms thick, and more preferably about 1,000 angstroms thick.

17. The article of claim 10, wherein said metallic foil is copper or alloys thereof, said stress relief material is amorphous silicon, and the material for said rigidizing layer is either amorphous silicon or titanium nitride.

18. The article of claim 17, wherein said rigidizing layer is between about 2 to 5 microns thick, said stress relief material coating is between about 40 and 80 angstroms thick, preferably about 50 angstroms thick, and said diamond like carbon coating is between about 500 and 1,200 angstroms thick, preferably between about 800 and 1,000 angstroms thick, and more preferably about 1,000 angstroms thick.

19. An erosion/corrosion resistance diaphragm for a cooling system of an integrated circuit chip, comprising a piston having a central opening for the passage of cooling fluid, said erosion/corrosion resistance diaphragm between said chip and said piston, and wherein said erosion/corrosion resistance diaphragm comprises, a metallic foil having a first surface and a second surface, wherein at least a portion of one of said surfaces of said metallic foil which will be exposed to erosion and/or corrosion has a coating of at least one rigidizing layer and one diamond like carbon layer or at least one rigidizing layer and successive coatings of stress relief material and diamond like carbon, to provide erosion and/or corrosion resistance and wherein said second surface is in contact with at least one integrated circuit chip.

20. The article of claim 19, wherein said metallic foil is selected from a group consisting of aluminum, copper, gold, indium, lead, molybdenum, silver, tin, titanium, tungsten, and alloys thereof.

21. The article of claim 19, wherein said stress relief material is amorphous silicon.

22. The article of claim 19, wherein said rigidizing layer is selected from a group consisting of aluminum nitride, amorphous silicon, silicon nitride, titanium nitride, tungsten carbide, and mixtures thereof.

23. The article of claim 19, wherein the total thickness of said diamond like carbon layer is between about 0.5 to about 1.5 microns thick.

24. The article of claim 19, wherein said rigidizing layer is between about 2 to 5 microns thick, and the total thickness of said successive coatings of stress relief material and diamond like carbon is between about 0.5 to about 1.5 microns thick.

25. The article of claim 19, wherein said rigidizing layer is between about 2 to 5 microns thick, said stress relief material coating is between about 40 and 80 angstroms thick, preferably about 50 angstroms thick, and said diamond like carbon coating is between about 500 and 1,200 angstroms thick, preferably between about 800 and 1,000 angstroms thick, and more preferably about 1,000 angstroms thick.

26. The article of claim 19, wherein said metallic foil is copper or alloys thereof, said stress relief material is amorphous silicon, and the material for said rigidizing layer is either amorphous silicon or titanium nitride.

27. The article of claim 26, wherein said rigidizing layer is between about 2 to 5 microns thick, said stress relief material coating is between about 40 and 80 angstroms thick, preferably about 50 angstroms thick, and said diamond like carbon coating is between about 500 and 1,200 angstroms thick, preferably between about 800 and 1,000 angstroms thick, and more preferably about 1,000 angstroms thick.

* * * * *